United States Patent
Cabral, Jr. et al.

(10) Patent No.: US 10,043,765 B2
(45) Date of Patent: *Aug. 7, 2018

(54) DAMAGING INTEGRATED CIRCUIT COMPONENTS

(71) Applicant: International Business Machines Corporation, Armonk, NY (US)

(72) Inventors: Cyril Cabral, Jr., Yorktown Heights, NY (US); Kenneth P. Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/722,219

(22) Filed: Oct. 2, 2017

(65) Prior Publication Data

US 2018/0047679 A1 Feb. 15, 2018

Related U.S. Application Data

(63) Continuation of application No. 15/198,709, filed on Jun. 30, 2016, now Pat. No. 9,859,227.

(51) Int. Cl.
*H01L 23/00* (2006.01)
*H01L 27/24* (2006.01)
*H01L 21/768* (2006.01)

(52) U.S. Cl.
CPC ...... *H01L 23/573* (2013.01); *H01L 21/76892* (2013.01); *H01L 27/2463* (2013.01)

(58) Field of Classification Search
CPC combination set(s) only.
See application file for complete search history.

(56) References Cited

U.S. PATENT DOCUMENTS

| 3,725,671 A | 4/1973 | Keister et al. |
| 5,042,386 A | 8/1991 | Kruse et al. |

(Continued)

FOREIGN PATENT DOCUMENTS

| CN | 103868417 A | 6/2014 |
| CN | 104867885 A | 8/2015 |

(Continued)

OTHER PUBLICATIONS

IBM Appendix P, "List of IBM Patents or Patent Applications to be Treated as Related", Dated Oct. 2, 2017, 2 pages.

(Continued)

*Primary Examiner* — Mamadou Diallo
(74) *Attorney, Agent, or Firm* — Adolph Bohnstedt; Arnold B. Bangali (57) ABSTRACT

An integrated circuit structure and formation thereof. The integrated circuit structure includes a substrate and a front-end-of-the-line (FEOL) portion. The FEOL portion rests on top of and in contact with the substrate. The integrated circuit structure includes a memory level portion. The memory level portion rests on top of and in contact with the FEOL portion. The integrated circuit structure includes a back-end-of-the-line (BEOL) portion. The BEOL portion rests on top of and in contact with the memory level portion. The integrated circuit structure includes a multiple layer that includes one or more pairs of reactive materials. The multiple layer is one or more of: i) on top of the BEOL portion; ii) within the BEOL portion; iii) within the memory level portion; iv) within the FEOL portion; v) embedded in the substrate; and vi) on bottom of a thinned substrate.

18 Claims, 9 Drawing Sheets

(56) References Cited

U.S. PATENT DOCUMENTS

| | | |
|---|---|---|
| 5,614,756 A | 3/1997 | Forouhi et al. |
| 5,883,429 A | 3/1999 | Houdeau et al. |
| 6,209,457 B1 | 4/2001 | Kenworthy et al. |
| 6,863,992 B2 | 3/2005 | Weihs et al. |
| 6,926,204 B2 | 8/2005 | Vacherand et al. |
| 7,143,568 B2 | 12/2006 | Van Heerden et al. |
| 7,469,640 B2 | 12/2008 | Nielson et al. |
| 7,489,013 B1 | 2/2009 | Chubin et al. |
| 7,535,105 B2 | 5/2009 | Voldman |
| 7,644,854 B1 | 1/2010 | Holmes et al. |
| 7,690,308 B2 | 4/2010 | Nielson et al. |
| 7,880,248 B1 | 2/2011 | Pham et al. |
| 7,896,988 B2 | 3/2011 | Mohler |
| 7,951,247 B2 | 5/2011 | Barbee, Jr. et al. |
| 8,105,859 B2 | 1/2012 | Breitwisch et al. |
| 8,495,382 B2 | 7/2013 | Johnson et al. |
| 8,581,617 B2 | 11/2013 | Reese et al. |
| 8,623,156 B1 | 1/2014 | Haines et al. |
| 8,669,806 B2 | 3/2014 | Rountree |
| 8,816,717 B2 | 8/2014 | Fritz et al. |
| 8,987,052 B2 | 3/2015 | Smith |
| 9,056,426 B2 | 6/2015 | Syassen |
| 9,431,354 B2 | 8/2016 | Cabral, Jr. et al. |
| 9,553,056 B1 | 1/2017 | Afzali-Ardakani et al. |
| 2007/0235500 A1* | 10/2007 | Suh .............. B23K 1/0006 228/101 |
| 2007/0257364 A1* | 11/2007 | Van Heerden ....... B23K 1/0006 257/737 |
| 2010/0012323 A1 | 1/2010 | Holmes et al. |
| 2011/0127314 A1* | 6/2011 | Heinrich .............. B23K 1/0006 228/123.1 |
| 2013/0250662 A1 | 9/2013 | Katti et al. |
| 2014/0042627 A1 | 2/2014 | Edelstein et al. |
| 2014/0103957 A1 | 4/2014 | Fritz et al. |
| 2014/0210110 A1 | 7/2014 | Smith |
| 2015/0060898 A1 | 3/2015 | Van Heerden et al. |
| 2016/0163658 A1 | 6/2016 | Cabral et al. |
| 2016/0300802 A1 | 10/2016 | Cabral et al. |

FOREIGN PATENT DOCUMENTS

| | | |
|---|---|---|
| RU | 2455728 C1 | 7/2012 |
| RU | 2455729 C1 | 7/2012 |
| RU | 2527241 C1 | 8/2014 |
| WO | 2008051300 A2 | 5/2008 |
| WO | 2016033123 A1 | 3/2016 |

OTHER PUBLICATIONS

IBM Appendix P, "List of IBM Patents or Patent Applications to be Treated as Related", Dated Nov. 1, 2017, 2 pages.

Cabral Jr., et al., "Activating Reactions in Integrated Circuits Through Electrical Discharge", U.S. Appl. No. 15/800,643, pp. 1-20.

Fischer et al., A Survey of Combustible Metals, Thermites, and Intermetallics for Pyrotechnic Applications, SAND95-2448C, 32nd AIAA/ASME/SAE/ASEE Joint Propulsion Conference, Lake Buena Vista, FL, Jul. 1-3, 1996, pp. 1-11.

Cabral et al., "Fragmenting Computer Chips", U.S. Appl. No. 15/222,056, filed Jul. 28, 2016, pp. 1-52.

Cabral et al., "Energy Release Using Tunable Reactive Materials", U.S. Appl. No. 15/017,944, filed Feb. 8, 2016, pp. 1-18.

Schuegraf et al., "Reliability of thin $SiO_2$", IOP Science, Semiconductor Science Technology, vol. 9, 989, No. 5, May 1994, doi:10. 1088/0268-1242/9/5/002, 1 page, <http://iopscience.iop.org/0268-1242/9/5/002>.

Wallash et al., "Electrical breakdown and ESD phenomena for devices with nanometer-to-micron gaps", SPIE proceedings, vol. 4980, Reliability, Testing, and Characterization of MEMS/MOEMS II, 87 (Jan. 25, 2003), doi:10.1117/12.478191, 10 pages, Downloaded From: <http://proceedings.spiedigitallibrary. org/ on Nov. 5, 2014, Terms of Use: http://spiedl.org/terms>.

Cabral et al., "Triggering Fragmenting Substrates", U.S. Appl. No. 62/080,586, filed Nov. 17, 2014, 9 pages.

Cabral Jr., et al., "Damaging Integrated Circuit Components", U.S. Appl. No. 15/198,709, pp. 1-27.

\* cited by examiner

DAMAGING INTEGRATED CIRCUIT COMPONENTS

STATEMENT REGARDING FEDERALLY SPONSORED WORK

This invention was made with United States Government support under contract number N00014-12-C-0472 entered with the following United States Governmental Agency: Department of Defense. The United States government has certain rights to this invention.

BACKGROUND OF THE INVENTION

The present invention relates generally to the field of intermetallic reactions, and more particularly to the destruction of integrated circuit (IC) components using intermetallic reactions.

Intermetallic reactions are exothermic reactions that involve numerous elements such as aluminum (Al), antimony (Sb), barium (Ba), beryllium (Be), bismuth (Bi), boron (B), cadmium (Cd), calcium (Ca), carbon (C), cerium (Ce), cobalt (Co), chromium (Cr), copper (Cu), germanium (Ge), hafnium (Hf), iron (Fe), lanthanum (La), lead (Pb), lithium (Li), magnesium (Mg), manganese (Mn), molybdenum (Mo), niobium (Nb), nickel (Ni), palladium (Pd), potassium (K), praseodymium (Pr), platinum (Pt), plutonium (Pu), samarium (Sm), selenium (Se), silicon (Si), sodium (Na), strontium (Sr), sulfur (S), tantalum (Ta), tellurium (Te), thorium (Th), tin (Sn), titanium (Ti), tungsten (W), uranium (U), vanadium (V), Yttrium (Y), zinc (Zn), and zirconium (Zr). The term "intermetallic reactions," which was introduced in the 1950s, has become somewhat of a misnomer since elements from virtually every periodic group except the halogens and noble gases participate in these reactions.

The individual elements used in intermetallic reactions tend to be relatively unreactive. However, strongly exothermic reactions take place when certain pairs of the elements are combined and ignited. Sources of ignition include electrical discharge, flame, mechanical friction, impact, etc. In many intermetallic reactions, oxygen is not required and no gases are produced. The products of many of these reactions are solid-state compounds exhibiting metallic bonding, defined stoichiometry, and an ordered crystal structure. Because of the intense heat generated, intermetallic reactions have found many uses in applications such as welding, bonding, melting, and microelectronics.

SUMMARY

According to one embodiment of the present disclosure, a structure comprising an integrated circuit structure. The integrated circuit structure includes a substrate and a front-end-of-the-line (FEOL) portion. The FEOL portion rests on top of and in contact with the substrate. The integrated circuit structure includes a memory level portion. The memory level portion rests on top of and in contact with the FEOL portion. The integrated circuit structure includes a back-end-of-the-line (BEOL) portion. The BEOL portion rests on top of and in contact with the memory level portion. The integrated circuit structure includes a multiple layer that includes one or more pairs of reactive materials. The multiple layer is one or more of: i) on top of the BEOL portion; ii) within the BEOL portion; iii) within the memory level portion; iv) within the FEOL portion; v) embedded in the substrate; and vi) on bottom of a thinned substrate.

According to one embodiment of the present disclosure, a method comprising forming a multiple layer within an integrated circuit region. The multiple layer includes one or more pairs of reactive materials. The method comprising igniting the multiple layer so that the one or more pairs of reactive materials react pairwise in one or more exothermic reactions. The method comprising damaging one or more components of an integrated circuit with energy released by the one or more exothermic reactions such that the one or more components are rendered, at least in part, permanently inoperable.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Intermetallic reactions have been used in stacks of thin films in order to non-destructively erase the contents of non-volatile memory. The stacks of thin films (referred hereafter as reactive material (RM) stacks) include layers of intermetallic reactants separated by barriers. The barriers serve to prevent reaction of the intermetallic reactants until an ignition event. Upon ignition, enough energy is released from the RM stacks to cause the phase change material (e.g., $Ge_2Sb_1Te_5$) within a plurality of phase change memory (PCM) cells to transition from an amorphous state to a poly-crystalline state thereby erasing the PCM non-destructively (i.e., the computing device containing the PCM is still operable).

The erasure of PCM serves to prevent the discovery of sensitive data through tampering. However, in some cases it is preferable to actually destroy integrated circuit (IC) components (e.g., devices, circuitry, memory arrays, interconnects, functional units, etc.) such that a computing device cannot be used again. For example, the loss of a computing device (e.g., cellphone, laptop, smartwatch) of a first user is, in some scenarios, less problematic if the device is rendered useless by irreversible damage to essential IC components before, upon, or subsequent to coming into the possession of another user. In some cases, the destruction of IC components is even more desirable when the computing device contains an integrated chip with a known resale value or is otherwise determined to be desirable for possession by that other user.

In order to engineer the intentional destruction of IC components in a computing device using RM stacks, at least three issues must be addressed. First, the RM stacks must be successfully introduced in close proximity to the targeted IC components before, during, or after chip fabrication. This requires that the RM stacks survive any process steps subsequent to their introduction. Many IC fabrication steps include the use of extremely high temperatures that may trigger the destructive exothermic reaction during fabrication, hence damaging the chip prematurely. Second, the RM stacks must be readily ignitable when it is desired to do so. In various embodiments this is controlled by barrier layers within the RM stacks. Third, the RM stacks must be capable of successfully destroying the target IC components without causing unacceptable injury and damage to individuals and property in the immediate vicinity of the computing device.

Embodiments of the present invention recognize that safely damaging IC components on a computing device is often desirable when the computing device has been lost or stolen. Embodiments of the present invention provide one or more processes for damaging IC components such as interconnects, transistors, memory arrays, circuitry for specific applications, etc.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

As described below in conjunction with FIGS. 1-10, embodiments may include methods of forming RM layers in close proximity to various IC components. The methods described below in conjunction with FIGS. 1-10 may be incorporated into typical semiconductor fabrication processes.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

As used herein, the term "and/or" is inclusive. For example, A, B, and/or C means that at least one of A or B or C is true and applicable.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As used herein, terms such as "depositing", "forming", and the like refer to the disposition of layers or portions of materials in the present embodiments. Such processes may not be different than in the standard practice of the art of IC fabrication. Such practice includes but is not limited to, metalorganic chemical vapor deposition (MOCVD), atomic layer deposition (ALD), chemical vapor deposition (CVD), low-pressure chemical vapor deposition (LPCVD), plasma enhanced chemical vapor deposition (PECVD), ultrahigh vacuum chemical vapor deposition (UHVCVD), physical vapor deposition, sputtering, plating, evaporation, ion beam deposition, electron beam deposition, laser assisted deposition, chemical solution deposition, or any combination of those methods.

As used herein, semiconductor structures refer to one or more physical structures that comprise semiconductor devices.

The present invention will now be described in detail with reference to the Figures.

Figure 1:
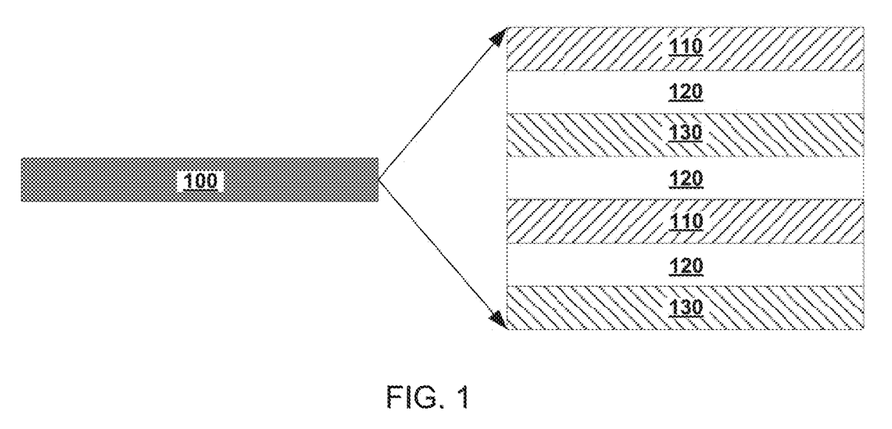
FIG. 1 illustrates a cross-sectional view of a reactive material (RM) stack in accordance with an exemplary embodiment of the present invention.

FIG. 1 illustrates a cross-sectional view of a reactive material (RM) stack 100 in accordance with an exemplary embodiment of the present invention.

RM stack 100 includes alternating layers of a first reactive material 110 (RM 110) and a second reactive material 130 (RM 130) with a barrier layer 120 sandwiched between each layer of the RM 110 and the RM 130. In various embodiments, RM stacks like RM stack 100 typically include up to one hundred of these layers and have a total thickness from approximately 0.5 µm to approximately 10 µm. However, embodiments of the present invention are not limited to the above description of potential RM stacks represented by RM stack 100. In various embodiments and scenarios, RM stacks represented by RM stack 100 include a number of layers of materials with respective compositions and thicknesses necessary to: i) withstand subsequent process steps in the fabrication of an IC containing said RM stacks, ii) readily initiate and propagate an exothermic chemical reaction when it is desired to do so, iii) after initiation of the exothermic chemical reaction, cause thermal damage to (i.e., make inoperable) one or more IC components that are above, beneath, and/or adjacent to said RM stacks, iv) self-propagate upon ignition so that an essentially complete reaction is obtained between RM 110 and RM 130 and/or v) minimize damage, respectively, to persons and property that are in the presence of, i.e., within a threshold distance of, a computing device containing said RM stacks after ignition. In some embodiments, the damage to one or more components of the computing device is such that the damage is not readily identifiable by an external examination of the computing device. For example, the damage is limited to a core processor of a smart phone and both the screen and casing of the smartphone are not physically damaged as is readily discernable by the human eye.

In various embodiments, RM stack 100 is integrated in the fabrication of an IC in one or more of the following ways: i) beneath or below a semiconductor substrate, ii) embedded within a semiconductor substrate, iii) integrated within a front-end-of-the line (FEOL) portion of an IC, iv) integrated within a memory level portion of an IC, v) integrated within a back-end-of-the-line (BEOL) portion of an IC, and vi) on top of a BEOL portion of an IC. In various embodiments, the semiconductor substrate is one or more of the following: i) a bulk semiconductor, ii) a semiconductor-on-insulator (SOI) substrate and iii) a III-V semiconductor substrate as known in the art. In various embodiments, the semiconductor substrate includes one or more of the following: i) glass, ii) silicon, iii) germanium, iv) sapphire (aluminum oxide) and v) a III-V semiconducting material.

In various embodiments, RM 110 and RM 130 react with each other exothermically upon ignition. In various embodiments, the reaction of the first and second reactive materials is ignited by a constant current, resistive heating, mechanical stress, an electric spark, a laser pulse, and/or other similar energy ignition sources, such as the energy indicated by a lightning bolt symbol, 101, in FIGS. 3A and 4A. In general, such initiation energy is great enough to initiate ignition of RM 110 and RM130.

In some embodiments, ignition of RM 110 and RM 130 causes the destruction of interconnects in a BEOL portion of an IC. In some embodiments, ignition of RM 110 and RM 130 causes the destruction of transistors in a FEOL portion of an IC. In some embodiments, ignition of RM 110 and RM 130 causes the destruction of memory arrays within a memory level portion of an IC. In some embodiments, ignition of RM 110 and RM 130 causes the destruction of circuitry for specific applications within an IC.

Exemplary sets of the RM 110 and RM 130 include, but are not limited to, Ni/Al, Al/Pd, Al/Pt, Cu/Pd, Nb/Si, and Ti/Al. Additional exemplary sets of RM 110 and RM 130 that are used in various embodiments of the present application are described in "A Survey of Combustible Metals, Thermites, and Intermetallics for Pyrotechnic Applications", by Fischer et al., 32nd AIAA/ASME/SAE/ASEE Joint Propulsion Conference, Lake Buena Vista, Fla., 1996, the disclosure of which is hereby incorporated by reference in its entirety.

Upon ignition, RM 110 and RM 130 intermix due to atomic diffusion to form an alloy, intermetallic and/or composite of RM 110 and the RM 130. The change in chemical bonding, caused by interdiffusion and compound formation, generates heat in an exothermic chemical reaction.

In various embodiments, the layers of RM 110 and RM 130 are provided using conventional film deposition techniques such as, for example, physical vapor deposition (PVD) or chemical vapor deposition (CVD), atomic layer deposition (ALD), electroplating and spin-on (sol-gel) processing. In one embodiment, the layers of RM 110 and RM 130 are deposited via evaporation at ambient temperature and the finished RM stack 100 is patterned by a lift-off process (resist dissolution in acetone to leave RM patterns in desired locations). In an exemplary embodiment, RM deposition is achieved via sputtering at temperatures as low as approximately 4° C.

In various embodiments, the thickness of RM 110 and RM 130 ranges from approximately 1 nm to approximately 200 nm. In other embodiments, lesser or greater thicknesses are utilized. In some embodiments, the thickness of the layers of RM 110 and RM 130 are substantially the same. In other embodiments, the layers of RM 110 and the layers of RM 130 are of a comparably different thickness. In various embodiments and scenarios, the thickness of RM 110 and RM 130 reflect the stoichiometry of the reaction between them. For example, if the desired intermetallic reaction is $Al_{(s)}+Pd_{(s)} \rightarrow AlPd_{(s)}$, then a layer of aluminum is deposited and a layer of palladium are deposited that are approximately equimolar to each other. However, if the desired intermetallic reaction is $Al_{(s)}+3Ni_{(s)} \rightarrow AlNi_{3(s)}$, then a layer of aluminum is deposited and a layer of nickel is deposited, wherein the molar amount of nickel in the layer of nickel is approximately three times the molar amount of aluminum in the aluminum layer.

Figure 2:
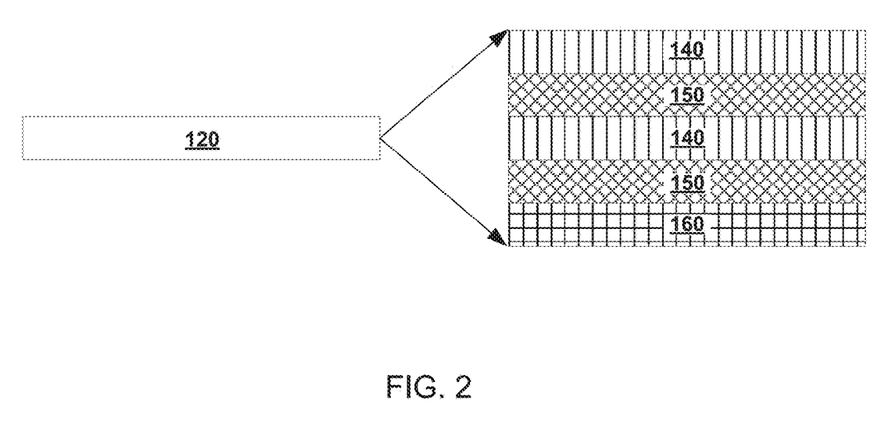
FIG. 2 illustrates a cross-sectional view of a barrier layer stack in accordance with an exemplary embodiment of the present invention.

FIG. 2 illustrates a cross-sectional view of barrier layer 120 in accordance with an exemplary embodiment of the present invention.

In various embodiments, barrier layer 120 acts as a diffusion barrier to reduce interdiffusion of RM 110 and RM 130 during deposition of RM 110 and RM 130 as well as during subsequent IC fabrication processes, thus preventing the reaction between RM 110 and RM 130 until ignition takes place. In some embodiments, barrier layer 120 includes transition metals, oxides of these transition metals, nitrides of these transition metals, aluminum oxide ($Al_xO_y$, with x from 1 to 2 and y from 1 to 3) or combinations thereof. Exemplary transition metals include, but are not limited to, Ti, Zr, Hf, V, Nb, Ta, the oxides of these exemplary transition metals, and the nitrides of these exemplary transition metals.

In some embodiments, barrier layer 120 is provided as a single layer structure. In other embodiments, barrier layer 120 is provided as a multiple layer stack (as depicted in FIG. 2). In some embodiments, barrier layer 120 is a single layer of a transition metal. In some embodiments where barrier layer 120 is a stack, barrier layer 120 includes a multiple layer stack selected from the group consisting of $Ta/Ta_xO_y$, $Al_xO_y/Ta/Ta_xO_y$ or $Al_xO_y/Ta/Ta_xO_y/Ta/Ta_xO_y$. For example and as shown in FIG. 2, barrier layer 120 includes a five-layer stack of $Al_xO_y$ (labeled as 160 in the drawing) and alternating layers of Ta (labeled as 150 in the drawing) and $Ta_xO_y$ (labeled as 140 in the drawing) with x from 1 to 3 and y from 1 to 5. It should be noted that the number of alternating layers in a barrier layer stack is not limited to five layers as shown in FIG. 2. In various embodiments, other numbers of alternating layers can also be utilized in the barrier layer 120. In some embodiments and scenarios, the thickness of barrier layer 120 is between approximately 1 nm to approximately 20 nm. In other embodiments, lesser and greater thicknesses of barrier layer 120 are utilized. In exemplary embodiments, the thickness of barrier layer 120 is 3-5 nm.

In various embodiments, barrier layer 120 is provided, for example, by PVD, CVD, ALD, electroplating and/or spin-on (sol-gel) processing. In one embodiment, the one or more layers included in barrier layer 120 are deposited via evaporation at ambient temperature and the finished RM stack 100 is patterned by a lift-off process (resist dissolution in acetone to leave RM patterns in desired locations). In an exemplary embodiment, deposition of the one or more layers included in barrier layer 120 is achieved via sputtering at temperatures as low as approximately 4° C. In one embodiment and when transition metal oxides or metal nitrides are employed in barrier layer 120, the transition metal oxide layer or the transition metal nitride layer is provided by first forming a transition metal layer and converting a surface portion of the transition metal layer by thermal nitridation and/or thermal oxidation. In a second embodiment the transition metal oxide or nitride is formed in a reactive sputtering process, by depositing the metal in the presence of oxygen or nitrogen.

It should be understood that embodiments of the present invention are not limited to an RM stack such as RM stack 100 containing only one pair of alternating reactive materials (i.e., RM 110 and RM 130). In some embodiments, two or more reactive material pairs are employed to form an RM stack. Further, it should be understood that embodiments of the present invention are not limited to an RM stack containing only one barrier layer composition of matter or thickness. In some embodiments, barrier layers 120 have various different compositions of matter and thicknesses in a single RM stack. Additionally, in some embodiments and scenarios, barrier layers do not always separate reactive material pairs. Thus, when it is feasible to deposit a reactive material pair without a barrier layer between them, it is typically more cost-effective and time-effective to do so.

Figure 3A:
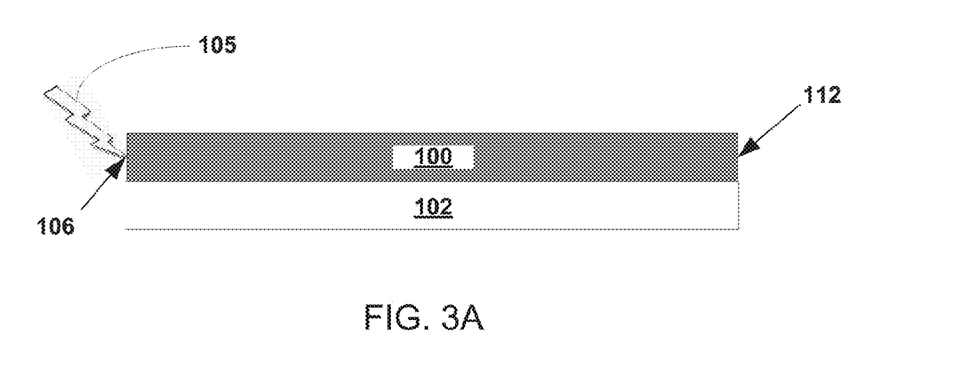
FIG. 3A-B illustrates a cross-sectional view of a partial reaction of an RM stack in accordance with an exemplary embodiment of the present invention.
Figure 3B:
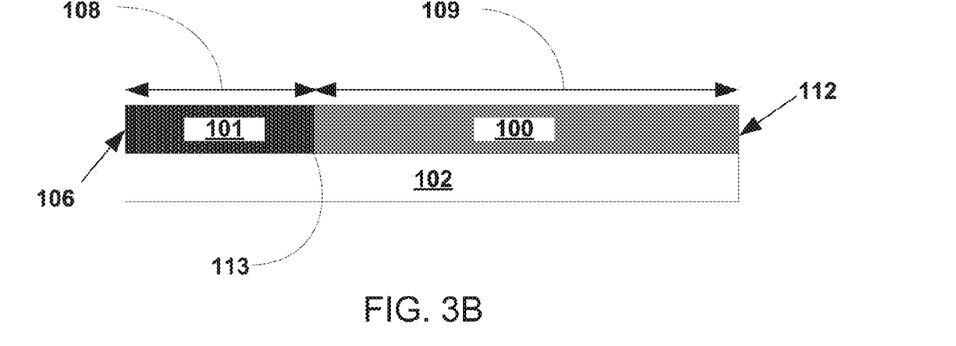

FIG. 3A-B illustrates a cross-sectional view of a partial reaction of RM stack 100 in accordance with an exemplary embodiment of the present invention.

In various embodiments, RM stack 100 is ignited by passing a constant current at various points along the stack. In one embodiment, a constant current density of 5 nA/$\mu$m$^2$ for less than 1 minute is sufficient to ignite an Al—Pd—Ta barrier system (i.e., RM 110 is aluminum, RM 130 is palladium (or vice versa), and barrier layer 120 includes tantalum). FIG. 3A depicts such an ignition event (i.e., 105) at an ignition point 106 when RM stack 100 is layered on non-insulating layer 102. The desired result after ignition is substantially complete reaction of RM stack 100 from ignition point 106 to termination point 112. After ignition, however, RM stack 100 is sometimes only partially reacted as depicted in FIG. 3B. Intermetallic product 101 is formed from a segment of RM stack 100 and extends only to a certain distance 108 from the ignition point 106 to an undesired termination point 113. The remainder of RM stack 100 is unreacted (i.e., the remaining portion of RM stack 100 as is indicated using distance 109).

Typically, the reason for the premature termination of the reaction of RM stack 100 is the presence of a heat sink that absorbs the heat from the exothermic reaction and prevents complete propagation of the reaction. The presence of foreign material particles may provide a heat sink that prevents a complete reaction of RM stack 100. Alternatively, contact with non-insulating layer 102 (e.g., substrate such as silicon, a metal, etc.) provides a sufficient heat sink to cause incomplete reaction of RM stack 100 as depicted in FIG. 3B. In some embodiments, an insulation layer is included between RM stack 100 and a heat sink. For example see insulating layer 103 in FIGS. 4A-B below. In such an embodiment, an insulation layer focuses/retains/inhibits the flow of energy out of RM stack 100 such that the reaction continues without a premature termination of the exothermic reaction even though a heat-sink or other like structure is present near RM stack 100.

Figure 4A:
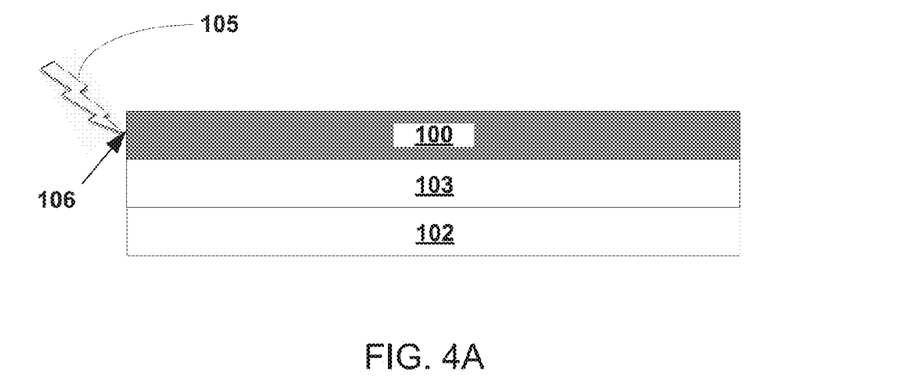
FIG. 4A-B illustrates a cross-sectional view of a substantially complete reaction of an RM stack in accordance with an exemplary embodiment of the present invention.
Figure 4B:
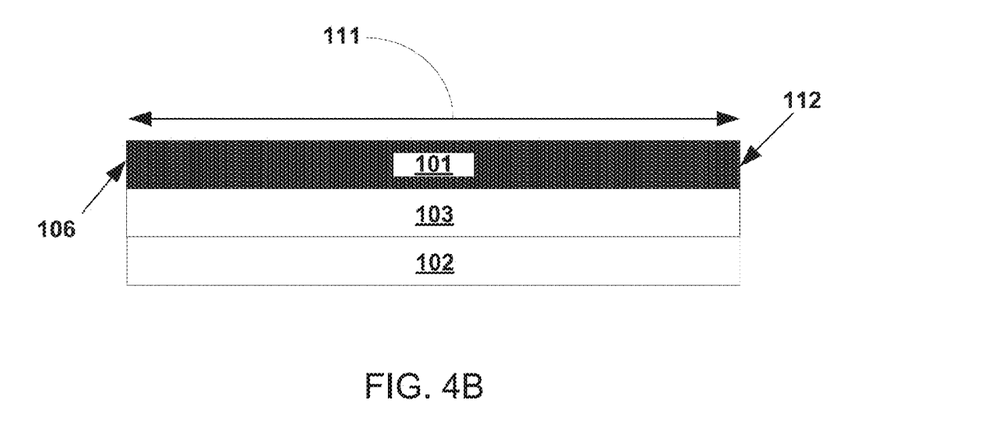

FIG. 4A-B illustrates a cross-sectional view of a substantially complete reaction of RM stack 100 in accordance with an exemplary embodiment of the present invention.

In various embodiments and as depicted in FIG. 4A, the placement of an thermal insulating layer such as insulating layer 103 (e.g. silicon dioxide or other dielectric layer) between and in contact with both RM stack 100 and non-insulating layer 102 prevents the premature termination of the intermetallic reaction after ignition of RM stack 100. Insulating layer 103 allows RM stack 100 to retain enough heat such that the reaction of RM stack 100 self-propagates from ignition point 106 to desired termination point 112. Thus, the presence of insulating layer 103 between RM stack 100 and non-insulating layer 102 allows a substantially complete reaction of RM stack 100 (i.e. intermetallic product 101 is formed to distance 111 from ignition point 106) as depicted in FIG. 4B.

In various embodiments, RM stacks such as RM stack 100 include insulating layers such as insulating layer 103 in contact with any location on the RM stacks, wherein the absence of the insulating layers would result in an incomplete reaction of the RM stacks because of contact with heat sinks. Hereafter, such insulated RM stacks are referred to as "insulated RM stacks." Thus, in some embodiments an insulated RM stack requires an insulating layer on the top of the RM stack (or portions of the top of the RM stack), on the sides of the RM stack (or portions of the sides of the RM stack), and/or on the bottom of the RM stack (or portions of the bottom of the RM stack) in order to be sufficiently insulated to undergo substantially complete reaction after ignition. In various embodiments, one or more insulating layers are included in an insulated RM stack to prevent premature termination of the exothermic reaction, which may not be limited to a bottom layer.

In various embodiments and scenarios, ignition of insulated RM stacks produce enough energy to melt silicon under copper vias. For example, an exemplary 26-layer RM stack composed of aluminum and palladium separated by tantalum-containing barrier layers produces an energy output of 2.9×10$^{-9}$ cal/$\mu$m$^3$ and an adiabatic temperature of 2653° C. In this example, the 26-layer RM stack is 850 nm thick and separated from the substrate and copper vias by a 200 nm thick insulating layer composed of silicon dioxide. In another example, the RM stack is separated from PCM memory by 1 to 1.5 $\mu$m of BEOL interconnects and low k dielectrics, such that heat released causes sufficient temperature at the PCM to erase it (causing it to crystallize), but not high enough to cause melting, cracking or interdiffusion (permanent damage).

The energy released after igniting an insulated RM stack does damage to surrounding circuitry in at least two ways. First, a thermal impact leads to extensive damage that includes the melting of metals and the cracking and/or vaporization of various dielectrics. Second, a shear force causes the fracture of underlying films and substrate.

FIGS. 5-10 illustrate various embodiments of an integrated circuit (IC), 200. In these embodiments, IC 200 includes several chip levels/portions such as: back-end-of-the-line (BEOL) portion 210, memory level portion 220, front-end-of-the-line (FEOL) portion 230, and substrate 240. The levels in various embodiments may be different than what is depicted in the embodiments of FIGS. 5-10. As such, these embodiments are not to be interpreted as limiting but illustrative in nature since one skilled in the art recognizes that such integrated circuits can include a wide variety of levels and structures that are encompassed by the spirit and scope of various embodiments.

Figure 5:
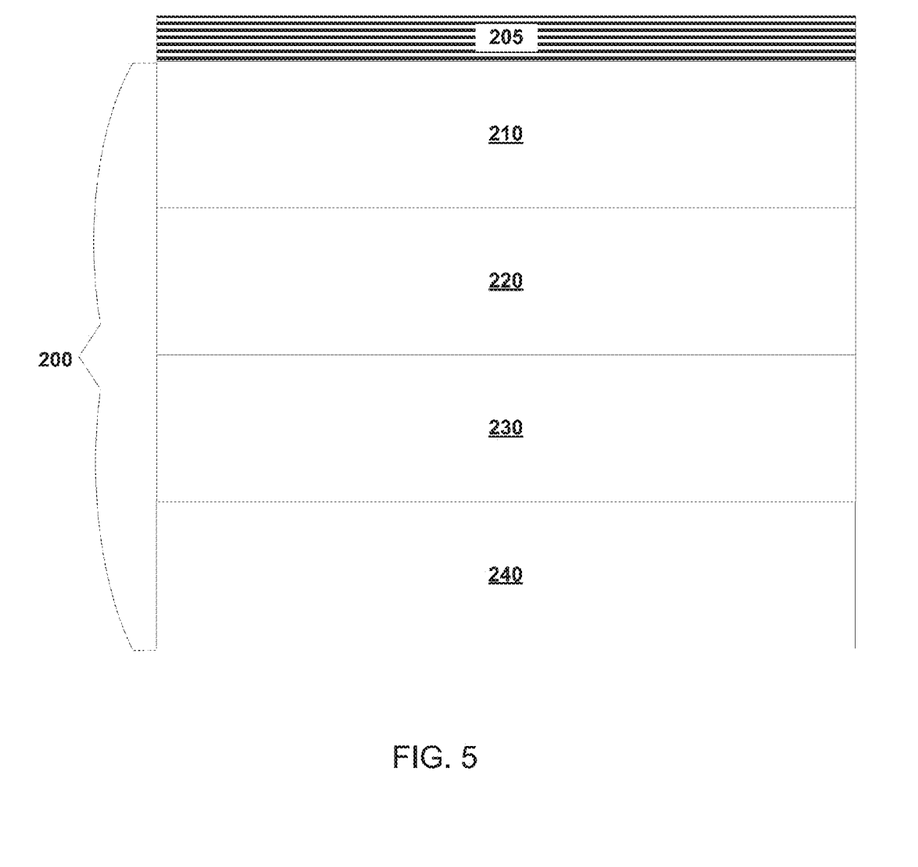
FIG. 5 illustrates a cross-sectional view of an insulated RM stack deposited on top of a back-end-of-the-line (BEOL) portion of an integrated circuit (IC) in accordance with an exemplary embodiment of the present invention.

FIG. 5 illustrates a cross-sectional view of insulated RM stack 205 deposited on top of back-end-of-the-line (BEOL) portion 210 of integrated circuit (IC) 200 in accordance with an exemplary embodiment of the present invention. BEOL portion 210 rests on top of memory layer portion 220. Memory layer portion 220 rests on front-end-of-the-line (FEOL) portion 230, which in turn rests on substrate 240.

In various embodiments and scenarios, ignition of insulated RM stack 205 on top of BEOL 210 causes the melting of the topmost interconnect metal layers of IC 200. In addition, the energy released from ignition of insulated RM stack 205 causes cracking and vaporization of the topmost low-k dielectric layers. Besides melting and cracking, which in various embodiments causes a complete interconnect disconnection, interdiffusion of other materials into metal or dielectric causes increased metal resistance and/or change in dielectric constant, which also makes the interconnect nonfunctional. The top most interconnect layers ("fat wire levels") are generally used to carry power to the various IC functional units. Thus, destroyed top interconnect portions will prevent power from reaching various functional units and make them inoperable. Likewise, various upper level interconnects send clock timing signals to circuits. In various embodiments, destruction of these upper level interconnects causes operations to perform out of sync or not at all, making those circuits incapable of performing their intended functions.

Figure 6:
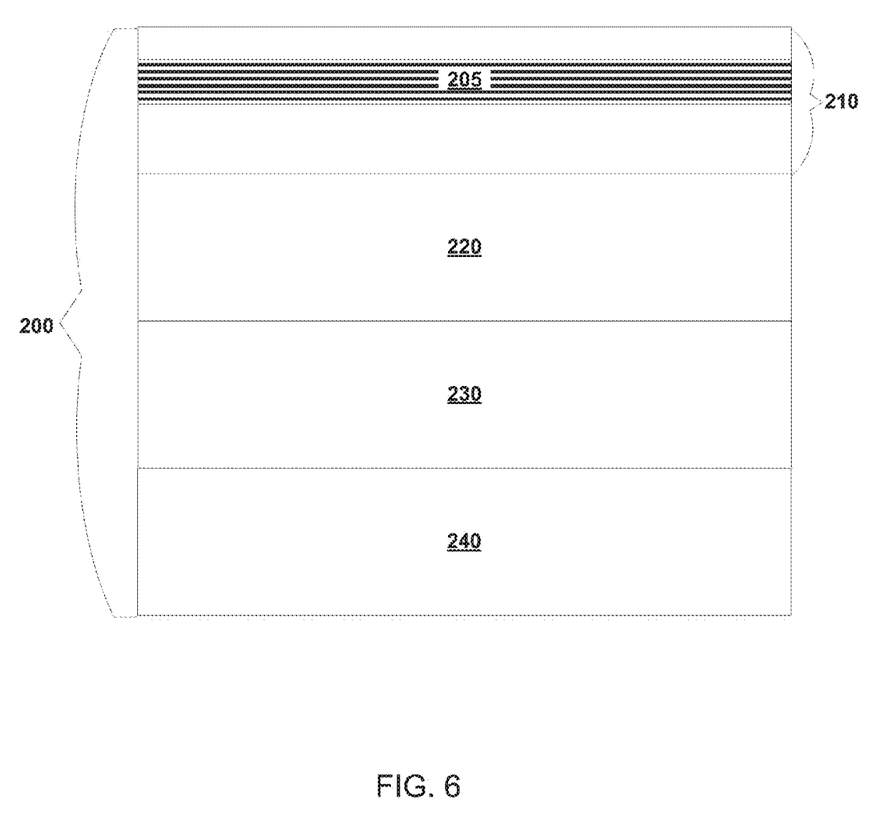
FIG. 6 illustrates a cross-sectional view of an insulated RM stack integrated within a BEOL portion of an IC in accordance with an exemplary embodiment of the present invention.

FIG. 6 illustrates a cross-sectional view of insulated RM stack 205 integrated within BEOL portion 210 of IC 200 in accordance with an exemplary embodiment of the present invention.

In the embodiments depicted in FIG. 6, insulated RM stack 205 is integrated into IC 200 during the BEOL portion 210 build. In various embodiments and scenarios, ignition of insulated RM stack 205 integrated within BEOL portion 210 causes at least the melting of lower interconnect metal layers of IC 200. In addition, the energy released from ignition of insulated RM stack 205 causes cracking and vaporization of the various low-k dielectric layers within BEOL portion 210. Besides melting and cracking, which in various embodiments causes a complete interconnect disconnection, interdiffusion of other materials into metal or dielectric causes increased metal resistance and/or change in dielectric constant, which also makes the interconnects nonfunctional. The interconnect wiring in the lower levels of a BEOL portion are generally used to move logical signals around the IC and to power clock timing down to particular transistors or groups of transistors. In various embodiments, using RM stack 205 to damage the interconnect wiring in the lower levels of a BEOL portion makes subsets of circuitry and/or isolated transistors inoperable. Making these circuitry and/or isolated transistors inoperable stops important logical operations that are critical to many applications.

Figure 7:
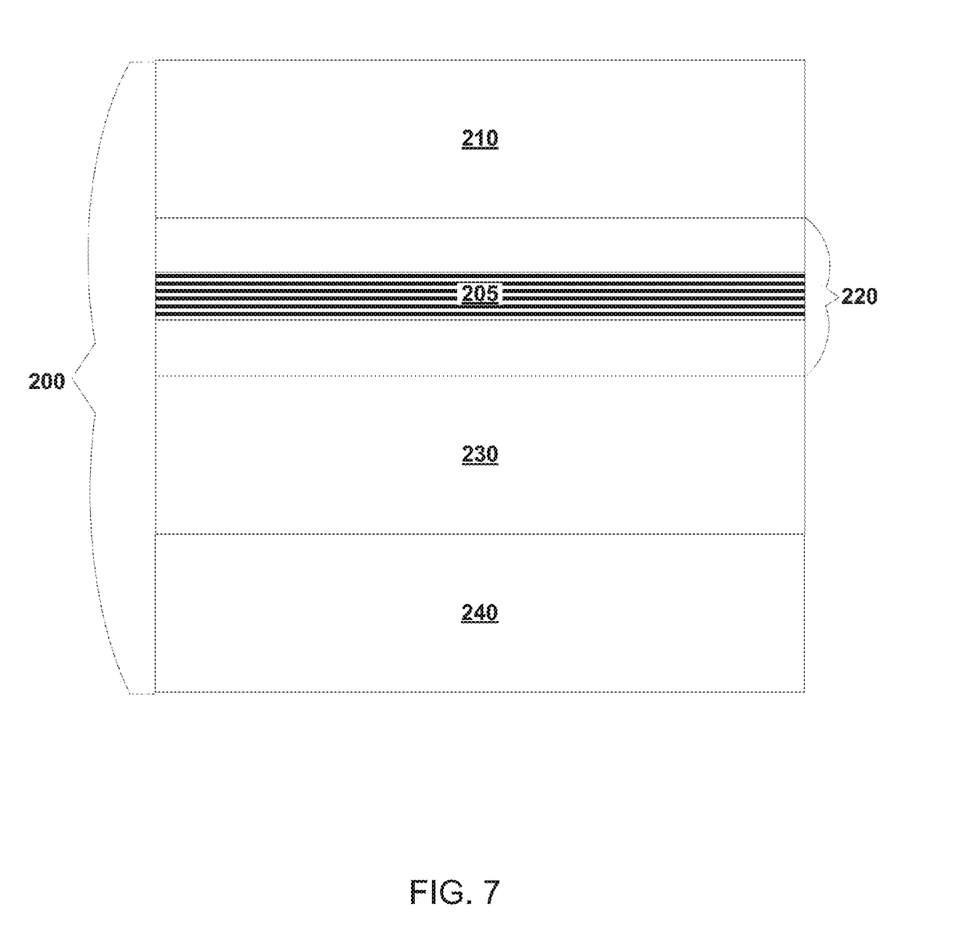
FIG. 7 illustrates a cross-sectional view of an insulated RM stack integrated within a memory level portion of an IC in accordance with an exemplary embodiment of the present invention.

FIG. 7 illustrates a cross-sectional view of insulated RM stack 205 integrated within a memory level portion 220 of IC 200 in accordance with an exemplary embodiment of the present invention.

In the embodiments depicted in FIG. 7, insulated RM stack 205 is integrated into IC 200 during the memory level portion 220 build. In various embodiments and scenarios, ignition of insulated RM stack 205 integrated within memory level portion 220 of IC 200 causes metal components within memory level portion 220 to melt. In addition, the energy released from ignition of insulated RM stack 205 causes cracking and vaporization of the various dielectric layers within memory level portion 220. The melting and cracking of metals and dielectrics along with an interdiffusion of RM into the memory level portion 220 of IC 200 changes the properties of metals and dielectrics within memory level portion 220. The resulting destroyed memory components are incapable of being further used and the information held within memory level portion 220 is permanently lost.

Figure 8:
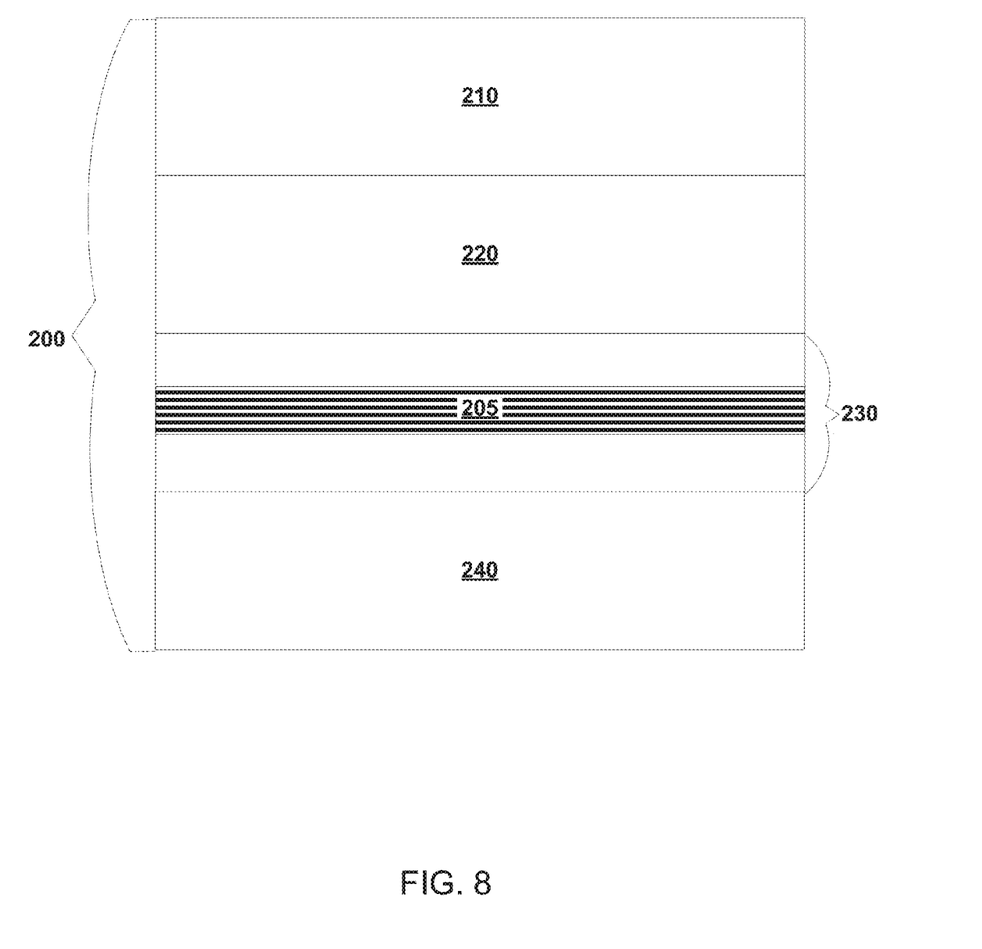
FIG. 8 illustrates a cross-sectional view of an insulated RM stack integrated within a front-end-of-the-line (FEOL) portion of an IC in accordance with an exemplary embodiment of the present invention.

FIG. 8 illustrates a cross-sectional view of insulated RM stack 205 integrated within front-end-of-the-line (FEOL) portion 230 of IC 200 in accordance with an exemplary embodiment of the present invention.

In the embodiments depicted in FIG. 8, insulated RM stack 205 is integrated into IC 200 during the FEOL portion 230 build. In various embodiments and scenarios, ignition of insulated RM stack 205 integrated within FEOL portion 230 causes cracking of the various dielectric layers and semiconductor layers within FEOL portion 230, thereby destroying the ability of transistors within FEOL portion 230 to perform logical operations and/or to allow access to memory. In addition, the interdiffusion of the various reactive material products into the transistors changes the electrical properties of the semiconductor material that the transistors are composed of, thereby rendering the transistors unable to function as designed. Lastly, the semiconductor dopant profile will change, rendering the intended function nonoperational.

Figure 9:
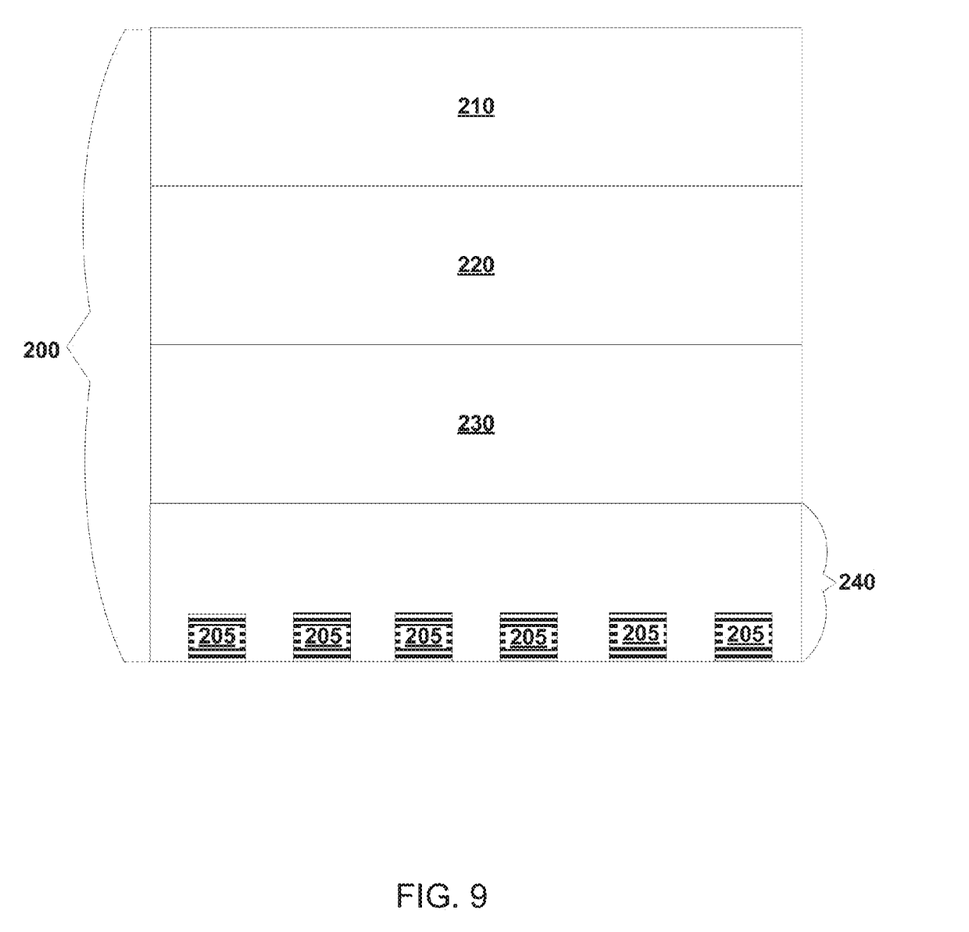
FIG. 9 illustrates a cross-sectional view of a plurality of insulated RM stacks embedded in trenches within a substrate of an IC in accordance with an exemplary embodiment of the present invention.

FIG. 9 illustrates a cross-sectional view of a plurality of insulated RM stacks 205 embedded in trenches within substrate 240 of IC 200 in accordance with an exemplary embodiment of the present invention.

In some embodiments depicted in FIG. 9, insulated RM stack 205 is embedded into IC 200 after packaging is completed with front side solder bumps (i.e., control collapse chip connections or C4s). The trenches that hold insulated RM stacks 205 are created beneath the substrate by either a wet or dry etch followed by performing an RM lift-off process. In various embodiments, insulated RM stacks 205 are positioned within substrate 240 and beneath targeted IC components in FEOL portion 230. In various embodiments and scenarios, ignition of insulated RM stack 205 embedded in FEOL portion 230 causes cracking of the various dielectric layers and semiconductor layers within both substrate 240 and FEOL portion 230. In addition, the interdiffusion of the various reactive material products into the transistors changes the electrical properties of the semiconductor material that the transistors are composed of, thereby rendering the transistors unable to function as designed. Lastly, the semiconductor dopant profile will change, rendering the intended function nonoperational.

Figure 10:
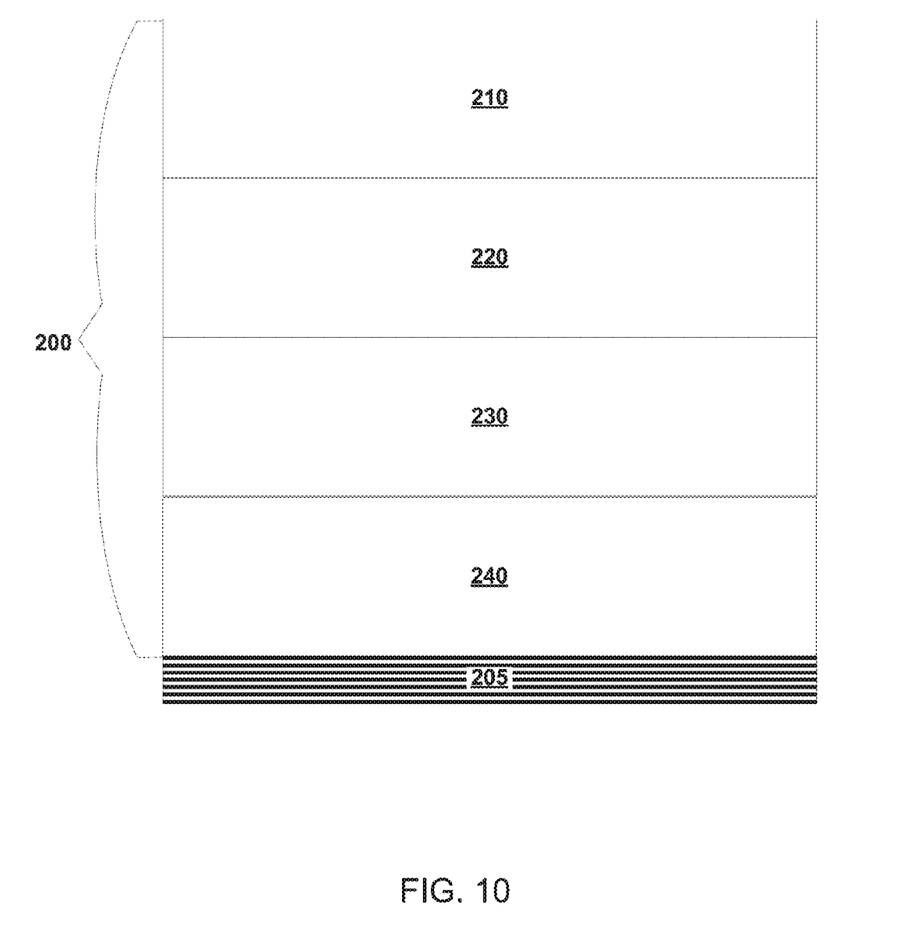
FIG. 10 illustrates a cross-sectional view of an insulated RM stack layered beneath a substrate of an IC in accordance with an exemplary embodiment of the present invention.

FIG. 10 illustrates a cross-sectional view of an insulated RM stack 205 layered beneath substrate 240 of IC 200 in accordance with an exemplary embodiment of the present invention.

In various embodiments, insulated RM stack 205 as depicted in FIG. 10 is a blanket film layered on a thinned substrate. The term "thinned substrate" as used herein is a substrate (e.g., silicon) that is less than 10 μm thick. In various embodiments and scenarios, ignition of insulated RM stack 205 as depicted in FIG. 10 and described herein causes widespread damage to the entire FEOL portion 230 of IC 200 through the cracking and vaporization of various dielectric layers and semiconductor layers within FEOL 230.

It should be understood that the embodiments depicted in FIGS. 5-10 are not limited to the deployment of insulated RM stack 205 in only the individual portions of IC 200. Various embodiments of the present invention include the deployment of RM stack 205 in combinations of the embodiments described in FIGS. 5-10. Thus, in various embodiments and scenarios, RM stack 205 is one or more of: i) on top of BEOL portion 210; ii) within BEOL portion 210; iii) within memory level portion 220; iv) within FEOL portion 220; v) embedded in substrate 240; and vi) on the bottom of substrate 240.

What is claimed is:

1. A method comprising:
    forming a layer within an integrated circuit region, wherein the layer includes two or more reactive materials;
    igniting the layer so that the two or more reactive materials react in one or more exothermic reactions; and
    damaging one or more components of an integrated circuit with energy released by the one or more exothermic reactions such that the one or more components are rendered, at least in part, inoperable.

2. The method of claim 1, wherein within the integrated circuit region is one or more of: i) on top of a back-end-of-the-line (BEOL) portion; ii) within the BEOL portion; iii) within a memory level portion; iv) within a front-end-of-the-line (FEOL) portion; v) embedded in a substrate; and vi) on bottom of a thinned substrate.

3. The method of claim 1, wherein the one or more components of the integrated circuit that are damaged are one or more of: i) one or more interconnects; ii) one or more transistors; iii) one or more memory arrays; and iv) circuitry for one or more applications.

4. The method of claim 1, wherein the two or more reactive materials are selected from the group consisting of: aluminum (Al), antimony (Sb), barium (Ba), beryllium (Be), bismuth (Bi), boron (B), cadmium (Cd), calcium (Ca), carbon (C), cerium (Ce), cobalt (Co), chromium (Cr), copper (Cu), germanium (Ge), hafnium (Hf), iron (Fe), lanthanum (La), lead (Pb), lithium (Li), magnesium (Mg), manganese (Mn), molybdenum (Mo), niobium (Nb), nickel (Ni), palladium (Pd), potassium (K), praseodymium (Pr), platinum (Pt), plutonium (Pu), samarium (Sm), selenium (Se), silicon (Si), sodium (Na), strontium (Sr), sulfur (S), tantalum (Ta), tellurium (Te), thorium (Th), tin (Sn), titanium (Ti), tungsten (W), uranium (U), vanadium (V), Yttrium (Y), zinc (Zn), and zirconium (Zr).

5. The method of claim 1, wherein the two or more reactive materials are selected from the group consisting of: aluminum (Al), copper (Cu), niobium (Nb), nickel (Ni), palladium (Pd), platinum (Pt), silicon (Si), and titanium (Ti).

6. The method of claim 1, wherein the layer includes one or more barrier layers.

7. The method of claim 6, wherein the one or more barrier layers include one or more materials selected from the group consisting of: one or more transition metals, one or more transition metal oxides, one or more transition metal nitrides, and one or more aluminum oxides.

8. The method of claim 6, wherein the one or more barrier layers include one or more materials selected from the group consisting of: titanium (Ti); zirconium (Zr); hafnium (Hf); vanadium (V); niobium (Nb); tantalum (Ta); one or more oxides of Ti, Zr, Hf, V, Nb, and Ta; and one or more nitrides of Ti, Zr, Hf, V, Nb, and Ta.

9. The method of claim 1, wherein the layer includes an insulating layer.

10. The method of claim 9, wherein the insulating layer is silicon dioxide.

11. An integrated circuit (IC) comprising:
    a substrate;
    a front-end-of-the-line (FEOL) portion, wherein the FEOL portion rests on top of the substrate;
    a memory level portion, wherein the memory level portion rests on top of the FEOL portion;
    a back-end-of-the-line (BEOL) portion, wherein the BEOL portion rests on top of the memory level portion; and
    a layer that includes two or more reactive materials, wherein the layer is one or more of: i) on top of the BEOL portion; ii) within the BEOL portion; iii) within the memory level portion; iv) within the FEOL portion; v) embedded in the substrate; and vi) on bottom of a thinned substrate.

12. The IC of claim 11, wherein the two or more reactive materials are selected from the group consisting of: aluminum (Al), antimony (Sb), barium (Ba), beryllium (Be), bismuth (Bi), boron (B), cadmium (Cd), calcium (Ca), carbon (C), cerium (Ce), cobalt (Co), chromium (Cr), copper (Cu), germanium (Ge), hafnium (Hf), iron (Fe), lanthanum (La), lead (Pb), lithium (Li), magnesium (Mg), manganese (Mn), molybdenum (Mo), niobium (Nb), nickel (Ni), palladium (Pd), potassium (K), praseodymium (Pr), platinum (Pt), plutonium (Pu), samarium (Sm), selenium (Se), silicon (Si), sodium (Na), strontium (Sr), sulfur (S), tantalum (Ta), tellurium (Te), thorium (Th), tin (Sn), titanium (Ti), tungsten (W), uranium (U), vanadium (V), Yttrium (Y), zinc (Zn), and zirconium (Zr).

13. The IC of claim 11, wherein the two or more reactive materials are selected from the group consisting of: aluminum (Al), copper (Cu), niobium (Nb), nickel (Ni), palladium (Pd), platinum (Pt), silicon (Si), and titanium (Ti).

14. The IC of claim 11, wherein the layer includes one or more barrier layers.

15. The IC of claim 14, wherein the one or more barrier layers include one or more materials selected from the group consisting of: one or more transition metals, one or more transition metal oxides, one or more transition metal nitrides, and one or more aluminum oxides.

16. The IC of claim 14, wherein the one or more barrier layers include one or more materials selected from the group consisting of: titanium (Ti); zirconium (Zr); hafnium (Hf); vanadium (V); niobium (Nb); tantalum (Ta); one or more oxides of Ti, Zr, Hf, V, Nb, and Ta; and one or more nitrides of Ti, Zr, Hf, V, Nb, and Ta.

17. The IC of claim 11, wherein the layer includes an insulating layer.

18. The IC of claim 17, wherein the insulating layer is silicon dioxide.

* * * * *